United States Patent
Darolia et al.

(10) Patent No.: US 6,682,827 B2
(45) Date of Patent: Jan. 27, 2004

(54) NICKEL ALUMINIDE COATING AND COATING SYSTEMS FORMED THEREWITH

(75) Inventors: Ramgopal Darolia, West Chester, OH (US); Joseph David Rigney, Milford, OH (US); Jeffrey Allan Pfaendtner, Blue Ash, OH (US)

(73) Assignee: General Electric Company, Schenectady, NY (US)

(*) Notice: Subject to any disclaimer, the term of this patent is extended or adjusted under 35 U.S.C. 154(b) by 40 days.

(21) Appl. No.: 10/029,320

(22) Filed: Dec. 20, 2001

(65) Prior Publication Data

US 2003/0118863 A1 Jun. 26, 2003

(51) Int. Cl.$^7$ .............................. B32B 15/04; F03B 3/12
(52) U.S. Cl. ...................... 428/632; 428/633; 428/652; 428/668; 428/670; 428/680; 428/469; 416/241 R
(58) Field of Search ................................. 428/632, 633, 428/652, 668, 670, 678, 680, 469; 420/445, 456, 460; 416/241 R, 241 B

(56) References Cited

U.S. PATENT DOCUMENTS

| | | | |
|---|---|---|---|
| 4,526,814 A | * 7/1985 | Shankar et al. | |
| 5,645,893 A | 7/1997 | Rickerby | 427/405 |
| 5,667,663 A | 9/1997 | Rickerby et al. | 205/170 |
| 5,716,720 A | 2/1998 | Murphy | 428/623 |
| 5,763,107 A | 6/1998 | Rickerby et al. | 428/623 |
| 5,843,585 A | * 12/1998 | Alperine et al. | |
| 5,856,027 A | * 1/1999 | Murphy | |
| 5,975,852 A | 11/1999 | Nagaraj et al. | |
| 5,981,091 A | 11/1999 | Rickerby et al. | 428/670 |
| 6,001,492 A | * 12/1999 | Jackson et al. | |
| 6,066,405 A | * 5/2000 | Schaeffer | |
| 6,153,313 A | 11/2000 | Rigney et al. | |
| 6,255,001 B1 | 7/2001 | Darolia | |
| 6,283,714 B1 | * 9/2001 | Rigney et al. | |
| 6,291,084 B1 | 9/2001 | Darolia et al. | |
| 6,340,500 B1 | * 1/2002 | Spitsberg | |
| 6,395,406 B1 | * 5/2002 | Sangeeta | |
| 6,472,018 B1 | * 10/2002 | Warnes et al. | |
| 6,475,642 B1 | 11/2002 | Zhao et al. | 428/636 |
| 6,475,647 B1 | 11/2002 | Mendez Acevedo et al. | 428/678 |
| 2002/0192494 A1 | 12/2002 | Tzatzov et al. | 428/655 |

OTHER PUBLICATIONS

Pint et al., *Substrate and Bond Coat Compositions: Factors Affecting Alumina Scale Adhesion*, NIST TBC Workshop 1997, Cincinnati OH (May 19–21, 1997), p. 109–125.

* cited by examiner

*Primary Examiner*—Deborah Jones
*Assistant Examiner*—Jennifer McNeil
(74) *Attorney, Agent, or Firm*—David L. Narciso; Gary M. Hartman; Domenita N. S. Hartman

(57) ABSTRACT

A protective overlay coating for articles used in hostile thermal environments, and particularly for use as a bond coat for a thermal barrier coating deposited on the coating. The coating is predominantly beta-phase NiAl into which a platinum-group metal is incorporated, yielding a coating system capable of exhibiting improved spallation resistance as compared to prior bond coat materials containing platinum, must notably the platinum aluminide diffusion coatings. A preferred composition for the beta-phase NiAl overlay coating further contains chromium and zirconium or hafnium.

20 Claims, 1 Drawing Sheet

NICKEL ALUMINIDE COATING AND COATING SYSTEMS FORMED THEREWITH

STATEMENT REGARDING FEDERALLY SPONSORED RESEARCH

This invention was made with Government support under Agreement No. N00019-96-C-0176 awarded by the U.S. Department of the Navy. The Government has certain rights in the invention.

CROSS REFERENCE TO RELATED APPLICATIONS

Not applicable.

BACKGROUND OF THE INVENTION

1. Field of the Invention

The present invention generally relates to coatings of the type used to protect components exposed to high temperature environments, such as the hostile thermal environment of a gas turbine engine. More particularly, this invention is directed to a predominantly beta ($\beta$) phase NiAl overlay coating alloyed with a platinum-group metal for use as an environmental coating and as a bond coat for a thermal barrier coating.

2. Description of the Related Art

Components within the turbine, combustor and augmentor sections of gas turbine engines are susceptible to oxidation and hot corrosion attack, in addition to high temperatures that can decrease their mechanical properties. Consequently, these components are often protected by an environmental coating alone or in combination with an outer thermal barrier coating (TBC), which in the latter case is termed a TBC system. Ceramic materials such as zirconia ($ZrO_2$) partially or fully stabilized by yttria ($Y_2O_3$), magnesia (MgO) or other oxides, are widely used as TBC materials.

Various metallic coating systems have been used as environmental coatings for gas turbine engine components, the most widely used being diffusion coatings such as diffusion aluminides and platinum aluminides (PtAl). Diffusion aluminide coatings are formed by reacting the surface of a component with an aluminum-containing vapor to deposit aluminum and form various aluminide intermetallics that are the products of aluminum and elements of the substrate material. Diffusion aluminide coatings formed in a nickel-base superalloy substrate contain such environmentally-resistant intermetallic phases as $\beta$(NiAl) and $\gamma$(Ni$_3$Al). By incorporating platinum, the coating may further include PtAl intermetallic phases, usually PtAl and $PtAl_2$, and platinum in solution in intermetallic phases.

Another widely used coating system is an overlay coating known as MCrAlX, where M is iron, cobalt and/or nickel, and X is an active element such as yttrium or another rare earth or reactive element. MCrAlX overlay coatings are typically deposited by physical vapor deposition (PVD), such as electron beam PVD (EBPVD) or sputtering, or by plasma spraying. MCrAlX overlay coatings differ from diffusion aluminide coatings as a result of the elements transferred to the substrate surface and the processes by which they are deposited, which can result in only limited diffusion into the substrate. If deposited on a nickel-base superalloy substrate, an MCrAlX coating will comprise a metallic solid solution that contains both gamma prime ($\gamma'$) and beta ($\beta$) NiAl phases. As with diffusion coatings, the incorporation of platinum into MCrAlX coatings has been proposed, such as an underlayer beneath or an overlayer on a NiCoCrAlY coating.

Used in combination with TBC, a diffusion aluminide or MCrAlX overlay coating serves as a bond coat to adhere the TBC to the underlying substrate. The aluminum content of these bond coat materials provides for the slow growth of a strong adherent continuous aluminum oxide layer (alumina scale) at elevated temperatures. This thermally grown oxide (TGO) protects the bond coat from oxidation and hot corrosion, and chemically bonds the TBC to the bond coat.

More recently, overlay coatings (i.e., not a diffusion) of betaphase nickel aluminide ($\beta$NiAl) intermetallic have been proposed as environmental and bond coat materials. The NiAl beta phase exists for nickel-aluminum compositions of about 30 to about 60 atomic percent aluminum, the balance of the nickel-aluminum composition being nickel. Notable examples of beta-phase NiAl coating materials include commonly-assigned U.S. Pat. No. 5,975,852 to Nagaraj et al., which discloses a NiAl overlay bond coat optionally containing one or more active elements, such as yttrium, cerium, zirconium or hafnium, and commonly-assigned U.S. Pat. No. 6,291,084 to Darolia et al., which discloses a NiAl overlay coating material containing chromium and zirconium. Commonly-assigned U.S. Pat. Nos. 6,153,313 and 6,255,001 to Rigney et al. and Darolia, respectively, also disclose beta-phase NiAl bond coat and environmental coating materials. The beta-phase NiAl alloy disclosed by Rigney et al. contains chromium, hafnium and/or titanium, and optionally tantalum, silicon, gallium, zirconium, calcium, iron and/or yttrium, while Darolia's beta-phase NiAl alloy contains zirconium. The beta-phase NiAl alloys of Nagaraj, Darolia et al., Rigney et al., and Darolia have been shown to improve the adhesion of a ceramic TBC layer, thereby inhibiting spallation of the TBC and increasing the service life of the TBC system.

Even with the advancements discussed above, there remains a considerable and continuous effort to further increase the service life of TBC systems by improving the spallation resistance of the thermal insulating layer.

BRIEF SUMMARY OF THE INVENTION

The present invention generally provides a protective overlay coating for articles used in hostile thermal environments, such as turbine, combustor and augmentor components of a gas turbine engine. The invention is particularly directed to a predominantly beta-phase NiAl overlay coating for use as a bond coat for a thermal barrier coating (TBC) deposited on the overlay coating. According to the invention, platinum or another platinum-group metal (e.g., rhodium or palladium) is incorporated into an NiAl-based coating composition, yielding a coating system capable of exhibiting improved spallation and hot corrosion resistance as compared to prior bond coat materials containing platinum, most notably platinum aluminide diffusion coatings. A preferred composition for the beta-phase NiAl overlay bond coat of this invention further contains certain amounts of chromium and zirconium or hafnium. Other possible alloying elements of the bond coat include yttrium, cerium, titanium, tantalum, silicon, gallium, calcium and/or iron.

As a beta-phase NiAl intermetallic, the overlay coating of this invention contains 30 to 60 atomic percent aluminum so as to be predominantly of the beta-NiAl phase. With the addition of platinum, the overlay coating may also contain platinum intermetallic phases, including $PtAl_2$, PtAl and NiPt. With the addition of chromium and zirconium or hafnium, the coating benefits from solid solution strengthening by chromium, and precipitation strengthening from fine α-Cr phases or β' Heusler phases (in combination with additions of zirconium) dispersed within the beta phase of the coating. When present together in a beta-phase NiAl overlay bond coat, these phases have been shown to improve the spallation resistance of a TBC deposited on the overlay bond coat. The beta-phase NiAl overlay coating of this invention is also believed to have application as an environmental coating. Also with the addition of chromium and zirconium or hafnium, precipitation reactions are believed to occur, potentially forming intermetallic phases with the platinum-group metal.

Other objects and advantages of this invention will be better appreciated from the following detailed description.

DETAILED DESCRIPTION OF THE INVENTION

Figure 1:
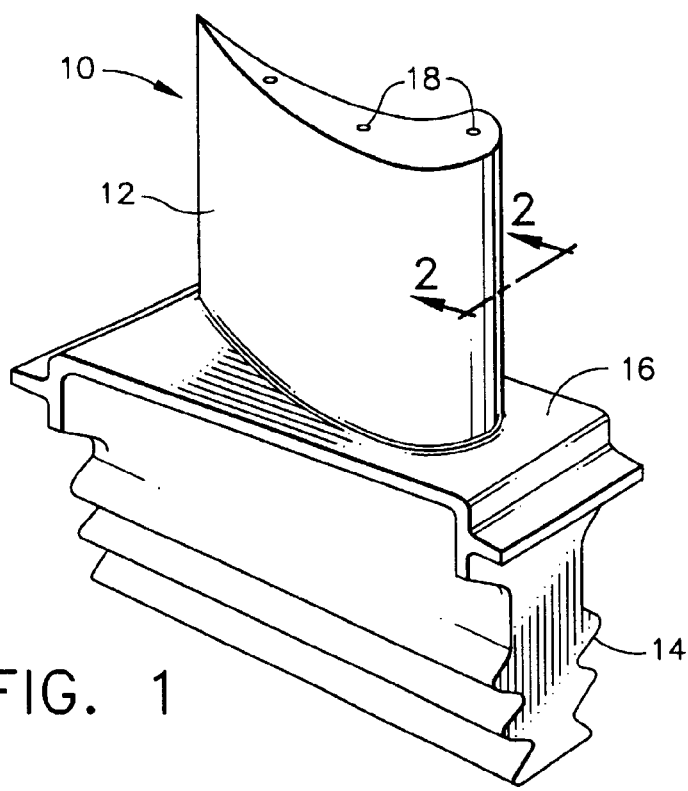
FIG. 1 is a perspective view of a high pressure turbine blade.

The present invention is generally applicable to components that operate within environments characterized by relatively high temperatures, and are therefore subjected to severe thermal stresses and thermal cycling. Notable examples of such components include the high and low pressure turbine nozzles and blades, shrouds, combustor liners and augmentor hardware of gas turbine engines. One such example is the high pressure turbine blade 10 shown in FIG. 1. The blade 10 generally includes an airfoil 12 against which hot combustion gases are directed during operation of the gas turbine engine, and whose surface is therefore subjected to severe attack by oxidation, corrosion and erosion. The airfoil 12 is anchored to a turbine disk (not shown) with a dovetail 14 formed on a root section 16 of the blade 10. Cooling holes 18 are present in the airfoil 12 through which bleed air is forced to transfer heat from the blade 10. While the advantages of this invention will be described with reference to the high pressure turbine blade 10 shown in FIG. 1, and particularly nickel-base superalloy blades of the type shown in FIG. 1, the teachings of this invention are generally applicable to any component on which a coating system may be used to protect the component from its environment.

Figure 2:
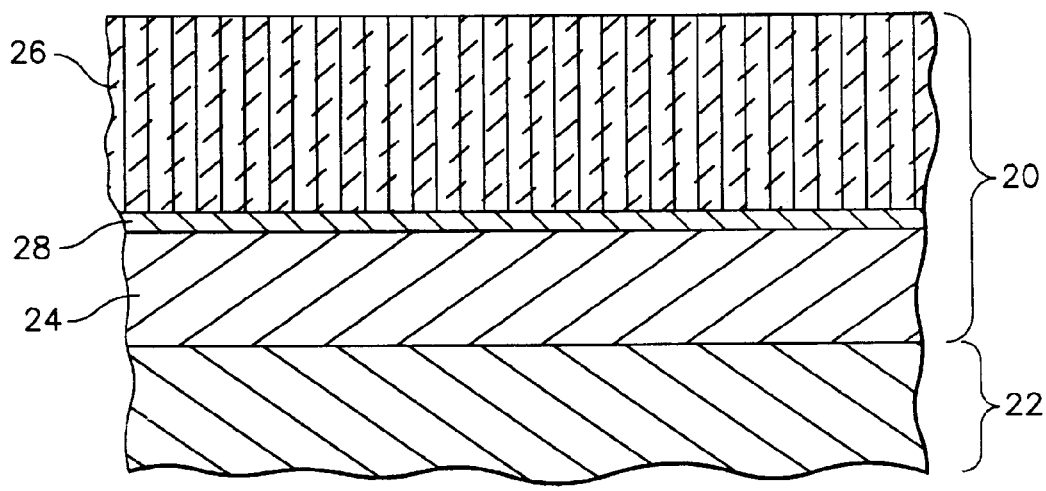
FIG. 2 is a cross-sectional view of the blade of FIG. 1 along line 2—2, and shows a thermal barrier coating system on the blade in accordance with an embodiment of this invention.

Represented in FIG. 2 is a TBC system 20 of a type that benefits from the teachings of this invention. As shown, the coating system 20 includes a ceramic layer 26 bonded to the blade substrate 22 with a NiAl overlay coating 24, which therefor serves as a bond coat to the ceramic layer 26. The substrate 22 (blade 10) is preferably a high-temperature material, such as an iron, nickel or cobalt-base superalloy. To attain a strain-tolerant columnar grain structure, the ceramic layer 26 is preferably deposited by physical vapor deposition (PVD), though other deposition techniques could be used. A preferred material for the ceramic layer 26 is an yttria-stabilized zirconia (YSZ), with a suitable composition being about 3 to about 20 weight percent yttria, though other ceramic materials could be used, such as yttria, nonstabilized zirconia, or zirconia stabilized by ceria ($CeO_2$), scandia ($Sc_2O_3$) or other oxides. The ceramic layer 26 is deposited to a thickness that is sufficient to provide the required thermal protection for the underlying substrate 22 and blade 10, generally on the order of about 100 to about 300 micrometers. As with prior art TBC systems, the surface of the overlay coating 24 oxidizes to form an oxide surface layer (scale) 28 to which the ceramic layer 26 chemically bonds.

According to the invention, the NiAl overlay coating 24 is predominantly of the beta (β) NiAl phase with limited alloying additions. The NiAl overlay coating 24 is preferably deposited using a PVD process, such as magnetron sputter physical vapor deposition or electron beam physical vapor deposition (EBPVD), or ion plasma deposition, though it is foreseeable that other deposition techniques could be used, such as thermal spraying of powders. According to the invention, a suitable thickness for the overlay coating 24 is about 50 micrometers to protect the underlying substrate 22 and provide an adequate supply of aluminum for oxide formation, though thicknesses of about 10 to about 125 micrometers are believed to be suitable. The above PVD techniques are preferably carried out to reduce the diffusion of the overlay coating 24 into the substrate 22. Preferably, deposition of the overlay coating 24 results in virtually no diffusion between the overlay coating 24 and substrate 22. During subsequent heat treatment to relieve residual stresses generated during the deposition process, a very thin diffusion zone, typically not more than about five micrometers, may develop. A suitable heat treatment is two to four hours at about 1800° F. to 2000° F. (about 980° C. to about 1090° C.) in a vacuum or an inert atmosphere such as argon.

To attain the beta-NiAl intermetallic phase, the NiAl overlay coating 24 of this invention has an aluminum content of about 30 to 60 atomic percent, preferably about 30 to 50 atomic percent, and more preferably at an atomic ratio of 1:1 with nickel. According to this invention, platinum or another platinum-group metal (e.g., rhodium or palladium) is also deposited in an amount to constitute at least about 5 up to about 40 weight percent (about 1 to about 12 atomic percent) of the coating 24, more preferably about 20 to 40 weight percent (about 5 to about 12 atomic percent) of the coating 24. The desired amount of platinum-group metal may be incorporated into the coating 24 as a predeposited layer on the substrate 22, a layer deposited on the coating 24, or by codeposition with the NiAl material to form the coating 24. In the first two methods, a platinum-group metal layer of about 0.0001 to about 0.0003 inch (about 2.5 to about 7.6 micrometers) is deposited and then at least partially diffused into the coating 24 by a suitable heat treatment, such as about 1700° F. to about 2100° F. (about 930° C. to about 1150° C.) for a duration of about one to about ten hours. The heat treatment also serves to adhere the platinum-group metal layer to the coating 24, as well as to the substrate 22 if predeposited on the substrate 22. If the platinum-group metal layer is deposited after deposition of the NiAl overlay coating 24, a single heat treatment can be performed to diffuse the platinum-group metal layer and stress relieve the coating 24.

In a preferred embodiment of the invention, the coating 24 is further alloyed to contain chromium and zirconium and/or hafnium. For example, the coating 24 may contain about 2 to about 15 atomic percent chromium and about 0.1 to about 1.2 atomic percent zirconium. More preferred levels for chromium and zirconium in the coating 24 are about 2 to about 10 atomic percent chromium and about 0.2 to about 0.7 atomic percent zirconium. In place of zirconium, the coating 24 may contain up to about 2 atomic percent hafnium in accordance with commonly-assigned U.S. Pat. No. 6,153,313 to Rigney et al. A suitable hafnium content for the coating 24 is about 0.1 to about 1.5 atomic percent, more preferably about 0.2 to about 1.0 atomic percent. According to U.S. Pat. No. 6,291,084 to Darolia et al., a combination of chromium and zirconium in the beta-phase NiAl overlay coating 24 has a significant effect on the spallation resistance of the ceramic layer 26 adhered to the NiAl overlay coating 24 to form the TBC system 20 as a result of solid solution strengthening by chromium, and precipitation strengthening from fine α-Cr phases or β' Heusler phases dispersed within the beta phase of the coating 24.

According to the invention, additions of platinum to a beta-phase NiAl overlay coating have been shown to provide a desirable level of spallation resistance for a ceramic layer deposited on the NiAl overlay coating. These benefits are believed to be the result of a higher activity of aluminum, promoting the formation of alpha alumina as the alumina scale 28, and beneficial interactions between platinum and sulfur that increase scale adhesion. It is further believed that the beta-phase NiAl+Pt overlay coating 24 of this invention will reduce wall consumption and improve performance (e.g., hot corrosion) due to reduced interdiffusion with the underlying substrate 22, leading to reduced contamination of the coating 24 from "tramp" elements from the substrate 22. The combination of chromium and platinum (or another platinum-group metal) in the coating 24 is believed to improve hot corrosion resistance as compared to diffusion aluminides that contain less chromium as a result of interdiffusion with the substrate 22. Finally, the combination of platinum (or another platinum-group metal) and zirconium (or another reactive element) in the coating 24 is expected to improve TBC life as a result of promote the formation of alpha-aluminum, increasing scale adhesion, and increasing coating strength.

During an investigation leading to this invention, furnace cycle tests (FCT) were performed on TBC systems employing bond coats formed of NiAlCrZr overlay coatings with and without platinum, which were then compared to FCT test data compiled for TBC systems employing bond coats formed of PtAl diffusion coatings. The overlay coatings were deposited to have a composition of about 35 to about 40 atomic percent aluminum, about 3 atomic percent chromium, about 0.3 to about 0.7 atomic percent zirconium, and about 2 to about 8 atomic percent platinum. The coatings were deposited on buttons formed of a nickel-base superalloy known as René N6, with a nominal composition of, by weight, 12.5% Co, 4.2% Cr, 7.2% Ta, 5.75% Al, 5.75% W, 5.4% Re, 1.4% Mo, 0.15% Hf, 0.05% C, 0.004% B, 0.01% Y, the balance nickel.

In the investigation, a first set of NiAlCrZr+Pt overlay coatings were formed by electroplating an approximately 7.6 micrometer-thick layer of platinum on some of the superalloy buttons, heat treating at about 1925° F. (about 1050° C.) for about two hours to inter-diffuse the platinum with the superalloy substrates, depositing by EBPVD an approximately 50 micrometer-thick layer of NiAlCrZr on the diffused platinum layers, and then heat treating at about 2000° F. (about 1090° C.) for about two hours to interdiffuse the platinum with the NiAlCrZr overlay coatings. For comparison, substantially identical specimens were prepared to have an EBPVD NiAlCrZr overlay coating, but without a platinum plating. A second set of NiAlCrZr+Pt overlay coatings were formed by electroplating an approximately 5.1 micrometer-thick layer of platinum on 50 micrometer-thick NiAlCrZr overlay coatings deposited by a high-velocity oxyfuel (HVOF) process on superalloy buttons, followed by heat treating at about 2000° F. (about 1090° C.) for about two hours. Prior to depositing the platinum layers, the NiAlCrZr coatings were surface ground to achieve a finish comparable to that of the EBPVD NiAlCrZr coatings. For comparison, substantially identical specimens were prepared to have an HVOF NiAlCrZr overlay coating, but without a platinum plating.

All of the buttons were coated by EBPVD with about five mils (about 125 micrometers) of 7%YSZ as the TBC material. The spallation life potentials of these coating systems were then evaluated by FCT at about 2125° F. (about 1160° C.) with one hour cycles. Testing was terminated for a given specimen when approximately 20 percent or more of its TBC had spalled. At the conclusion of the test, the NiAlCrZr+Pt test specimens with NiAlCrZr deposited by EBPVD exhibited FCT lives of 180, 320, 340, 560 and 580 cycles, for an average of 398 cycles, while the NiAlCrZr+Pt test specimens with NiAlCrZr deposited by HVOF exhibited FCT lives of 140, 160 and 340 cycles, for an average of 213 cycles. The baseline average FCT lives for PtAl diffusion bond coats, NiAlCrZr bond coats deposited by EBPVD, and NiAlCrZr bond coats deposited by HVOF were 238, 480 and 350 cycles, respectively. As a result, the EBPVD NiAlCrZr+Pt test specimens exhibited an average FCT life of about 1.7 times greater than the PtAl baseline, though less than the EBPVD NiAl+Cr+Zr baseline, while the HVOF NiAlCrZr+Pt test specimens exhibited an average FCT life of slightly less than the PtAl baseline and less than the HVOF NiAlCrZr baseline. Those EBPVD NiAlCrZr+Pt specimens with FCT lives of less than 500 cycles were examined and found to have spalled as a result of poor adhesion between the platinum-rich layer and the NiAl overlay coating. The HVOF NiAlCrZr+Pt specimens with FCT lives of less than 200 cycles were also examined and found to have spalled as a result of poor adhesion between the platinum-rich layer and the TBC. From these observations, it was concluded that EBPVD and HVOF NiAlCrZr+Pt bond coats could be capable of consistently exhibiting thermal cycle fatigue lives greater than NiAl+Cr+Zr bond coats if modified or different platinum deposition and heat treatment techniques were used, particularly with respect to platinum deposited on NiAl+Cr+Zr coatings, as was the case with the HVOF NiAl+Cr+Zr specimens.

While the invention has been described in terms of a preferred embodiment, it is apparent that modifications could be adopted by one skilled in the art. Accordingly, the scope of the invention is to be limited only by the following claims.

What is claimed is:

1. A coating system (20) on a superalloy substrate (22), the coating system (20) comprising a beta-phase NiAl intermetallic overlay coating (24) containing nickel and, in atomic percent, about 30% to about 60% aluminum and about 1% to about 12% platinum-group metal, the overlay coating (24) consisting essentially of intermetallic phases comprising beta-phase NiAl and platinum-group intermetallic phases.

2. A coating system (20) according to claim 1, further comprising a thermal-insulating ceramic layer (26) adhered to the overlay coating (24).

3. A coating system (20) according to claim 1, wherein the overlay coating (24) further contains at least one of chromium, zirconium, and hafnium.

4. A coating system (20) according to claim 1, wherein the overlay coating (24) consists of nickel, aluminum, platinum, chromium, and zirconium and/or hafnium.

5. A coating system (20) according to claim 1, wherein the overlay coating (24) consists essentially of, in atomic percent, 30% to 60% aluminum, about 5% to about 12% platinum, about 2% to about 15% chromium, about 0.1% to about 1.2% zirconium, the balance essentially nickel.

6. A coating system (20) according to claim 5, wherein the chromium content of the overlay coating (24) is about 2% to about 10% atomic percent.

7. A coating system (20) according to claim 5, wherein the zirconium content of the overlay coating (24) is about 0.2% to about 0.7% atomic percent.

8. A coating system (20) according to claim 1, wherein nickel and aluminum are present in the overlay coating (24) in approximately equal amounts.

9. A coating system (20) on a superalloy substrate (22), the coating system (20) comprising a ceramic layer (26) on a beta-phase NiAl intermetallic overlay bond coat (24), the overlay bond coat (24) consisting of, in atomic percent, 30% to 50% aluminum, about 1% to about 12% platinum, about 2% to about 15% chromium, about 0.1% to about 1.2% zirconium, the balance nickel, the overlay bond coat (24) consisting essentially of intermetallic phases comprising beta-phase NiAl and platinum intermetallic phases.

10. A coating system (20) according to claim 9, wherein the aluminum content of the overlay bond coat (24) is about 35 to about 40 atomic percent.

11. A coating system (20) according to claim 9, wherein the chromium content of the overlay bond coat (24) is about 3 atomic percent.

12. A coating system (20) according to claim 9, wherein the zirconium content of the overlay bond coat (24) is about 0.3 to about 0.7 atomic percent.

13. A coating system (20) according to claim 9, wherein the platinum content of the overlay bond coat (24) is about 2 to about 8 atomic percent.

14. A coating system (20) according to claim 9, wherein nickel and aluminum are present in the overlay bond coat (24) in approximately equal amounts.

15. A coating system (20) according to claim 9, wherein the ceramic layer (26) is yttria-stabilized zirconia.

16. A coating system (20) on a superalloy substrate (22), the coating system (20) comprising a beta-phase NiAl intermetallic overlay coating (24) consisting of nickel, aluminum, platinum, chromium, and one or both of zirconium and hafnium, the overlay coating containing, in atomic percent, about 30% to about 60% aluminum and about 1% to about 12% platinum-group metal, the overlay coating (24) consisting essentially of intermetallic phases comprising beta-phase NiAl and platinum-group intermetallic phases.

17. A coating system (20) according to claim 16, further comprising a thermal-insulating ceramic layer (26) adhered to the overlay coating (24).

18. A coating system (20) according to claim 16, wherein the overlay coating (24) consists of, in atomic percent, 30% to 60% aluminum, about 5% to about 12% platinum, about 2% to about 15% chromium, about 0.1% to about 1.2% zirconium, the balance essentially nickel.

19. A coating system (20) according to claim 16, wherein the chromium content of the overlay coating (24) is about 2% to about 10% atomic percent.

20. A coating system (20) according to claim 16, wherein the zirconium content of the overlay coating (24) is about 0.2% to about 0.7% atomic percent.

* * * * *